US011949273B2

United States Patent
Zhong et al.

(10) Patent No.: US 11,949,273 B2
(45) Date of Patent: Apr. 2, 2024

(54) METHOD FOR MANAGING CHARGING AND DISCHARGING OF PARALLEL-CONNECTED BATTERY PACK, ELECTRONIC DEVICE, AND ELECTRICAL SYSTEM

(71) Applicant: Dongguan Poweramp Technology Limited, Dongguan (CN)

(72) Inventors: Di Zhong, Dongguan (CN); Si Zeng, Dongguan (CN)

(73) Assignee: Dongguan Poweramp Technology Limited, Dongguan (CN)

( * ) Notice: Subject to any disclaimer, the term of this patent is extended or adjusted under 35 U.S.C. 154(b) by 424 days.

(21) Appl. No.: 17/281,667

(22) PCT Filed: Feb. 9, 2021

(86) PCT No.: PCT/CN2021/076382
§ 371 (c)(1),
(2) Date: Mar. 31, 2021

(87) PCT Pub. No.: WO2021/190196
PCT Pub. Date: Sep. 30, 2021

(65) Prior Publication Data
US 2022/0123576 A1    Apr. 21, 2022

(30) Foreign Application Priority Data
Mar. 27, 2020   (CN) .......................... 202010230929.9

(51) Int. Cl.
*H02J 7/00* (2006.01)
*G01R 31/3835* (2019.01)

(52) U.S. Cl.
CPC .... *H02J 7/007182* (2020.01); *G01R 31/3835* (2019.01); *H02J 7/0013* (2013.01);
(Continued)

(58) Field of Classification Search
CPC .............. H02J 7/007182; H02J 7/0013; G01R 31/3835
(Continued)

(56) References Cited

U.S. PATENT DOCUMENTS 4,553,081 A    11/1985  Koenck
9,484,763 B2 *  11/2016  Kim ...................... H02J 7/0014
(Continued)

FOREIGN PATENT DOCUMENTS

CN    102082307 A  *  6/2011  ........ H01M 10/4207
CN    202260493 U    5/2012
(Continued)

OTHER PUBLICATIONS

Office Action dated Feb. 25, 2022, issued in counterpart AU application No. 2021202731. (6 pages).
(Continued)

*Primary Examiner* — Phallaka Kik
(74) *Attorney, Agent, or Firm* — WHDA, LLP

(57)  ABSTRACT

A method for managing charging and discharging of a parallel-connected battery pack, including: obtaining a voltage value and a state of charge of a plurality of battery packs; comparing the voltage value and the state of charge of each of the battery packs with a reference voltage value and a reference state of charge; and managing charging and discharging of the plurality of battery packs based on a comparison result. The method can enhance automation of paralleling of battery packs, increase adaptability of a paralleling system, improve paralleling efficiency, further reduce operation and maintenance costs, and improve user experience.

14 Claims, 7 Drawing Sheets

(52) U.S. Cl.
CPC .......... *H02J 7/0029* (2013.01); *H02J 7/0048* (2020.01); *H02J 7/005* (2020.01)

(58) Field of Classification Search
USPC ................ 320/126, 125, 134, 136, 160, 164
See application file for complete search history.

(56) References Cited

U.S. PATENT DOCUMENTS

| | | | | |
|---|---|---|---|---|
| 10,110,033 | B1 * | 10/2018 | Hom | H02J 7/007182 |
| 10,277,041 | B2 | 4/2019 | Zane et al. | |
| 11,214,171 | B2 * | 1/2022 | Wang | B60L 58/22 |
| 11,820,218 | B2 * | 11/2023 | Zeiler | H02J 7/0045 |
| 11,831,186 | B2 * | 11/2023 | Sherstyuk | H02J 7/0071 |
| 11,843,278 | B2 * | 12/2023 | Beaston | H02J 7/0048 |
| 2008/0238356 | A1 | 10/2008 | Batson et al. | |
| 2012/0223677 | A1 * | 9/2012 | Yamauchi | H02J 7/34 320/134 |
| 2013/0187466 | A1 | 7/2013 | Sakai et al. | |
| 2014/0021924 | A1 * | 1/2014 | Abe | H02J 13/00017 320/118 |
| 2014/0077765 | A1 * | 3/2014 | Gao | H02J 7/0016 320/126 |
| 2014/0103876 | A1 * | 4/2014 | Kim | H02J 7/0024 320/112 |
| 2015/0070023 | A1 * | 3/2015 | Kudo | G01R 31/396 324/426 |
| 2015/0194707 | A1 | 7/2015 | Park | |
| 2015/0323609 | A1 * | 11/2015 | Kudo | B60L 58/19 324/433 |
| 2016/0226268 | A1 | 8/2016 | Okui | |
| 2016/0254683 | A1 | 9/2016 | Matsumoto et al. | |
| 2016/0336767 | A1 | 11/2016 | Zane et al. | |
| 2019/0089020 | A1 * | 3/2019 | Ikeno | H01M 10/441 |
| 2019/0123567 | A1 | 4/2019 | Kaneko | |
| 2020/0055405 | A1 | 2/2020 | Duan et al. | |
| 2020/0235440 | A1 * | 7/2020 | Hao | H01M 10/441 |
| 2020/0244075 | A1 | 7/2020 | Park et al. | |
| 2020/0333402 | A1 * | 10/2020 | Jan | H01M 10/441 |
| 2020/0373764 | A1 * | 11/2020 | Lee | H02J 7/0063 |
| 2020/0412132 | A1 * | 12/2020 | Kristjansson | H02J 7/00714 |
| 2020/0412135 | A1 * | 12/2020 | Singer | H02J 7/0014 |
| 2020/0412136 | A1 * | 12/2020 | Kristjansson | H02J 7/0063 |
| 2021/0066761 | A1 * | 3/2021 | Whitney | H01M 10/482 |
| 2021/0083505 | A1 * | 3/2021 | Beaston | H02J 3/381 |
| 2021/0135308 | A1 * | 5/2021 | Hwang | H01M 10/44 |
| 2021/0143650 | A1 * | 5/2021 | Wang | H02J 7/00304 |
| 2021/0206290 | A1 * | 7/2021 | Li | B60L 58/14 |
| 2021/0226267 | A1 * | 7/2021 | Books | G01R 31/382 |
| 2021/0249701 | A1 * | 8/2021 | Shine | H01M 10/4257 |
| 2021/0399554 | A1 * | 12/2021 | Sherstyuk | H02J 7/0014 |
| 2022/0311067 | A1 * | 9/2022 | Nedjimi | G01R 31/392 |
| 2022/0407122 | A1 * | 12/2022 | Marshall | H02J 7/345 |
| 2023/0050393 | A1 * | 2/2023 | Stroud | H01M 50/289 |

FOREIGN PATENT DOCUMENTS

| | | | | |
|---|---|---|---|---|
| CN | 103081281 | A | 5/2013 | |
| CN | 103414224 | A | 11/2013 | |
| CN | 105098920 | A | 11/2015 | |
| CN | 105814768 | A | 7/2016 | |
| CN | 206313501 | U | 7/2017 | |
| CN | 107599859 | A | 1/2018 | |
| CN | 107863789 | A | 3/2018 | |
| CN | 108206560 | A | 6/2018 | |
| CN | 110266066 | A | 9/2019 | |
| CN | 110281811 | A | 9/2019 | |
| CN | 110783989 | A | 2/2020 | |
| CN | 110834567 | A | 2/2020 | |
| CN | 110838737 | A | 2/2020 | |
| CN | 111431228 | A | 7/2020 | |
| EP | 3048663 | A1 | 7/2016 | |
| JP | 2010-521947 | A | 6/2010 | |
| JP | 2010-271286 | A | 12/2010 | |
| JP | 2013-179739 | A | 9/2013 | |
| JP | 2015-80334 | A | 4/2015 | |
| JP | 2015080334 | A * | 4/2015 | B60L 58/13 |
| JP | WO2018056263 | A1 * | 6/2019 | H02J 7/00 |
| JP | 2019-532605 | A | 11/2019 | |
| KR | 10-2016-0094228 | A | 8/2016 | |
| KR | 20180049545 | A * | 5/2018 | H02J 7/0036 |
| KR | 10-2019-0128913 | A | 11/2019 | |
| WO | WO-2011157116 | A1 * | 12/2011 | H01M 10/4207 |
| WO | 2012/049965 | A1 | 4/2012 | |
| WO | WO-2012049965 | A1 * | 4/2012 | G01R 19/16542 |
| WO | 2018/056263 | A1 | 3/2018 | |

OTHER PUBLICATIONS

Office Action dated Aug. 10, 2022, issued in counterpart AU application No. 2021202731. (4 pages).
Office Action dated Nov. 15, 2022, issued in counterpart AU application No. 2021202731. (4 pages).
Office Action dated Feb. 27, 2023, issued in counterpart AU application No. 2021202731. (4 pages).
Office Action dated Oct. 31, 2022, issued in counterpart CN application No. 202010230929.9. (11 pages).
Office Action dated Apr. 20, 2023, issued in counterpart CN application No. 202010230929.9. (4 pages).
Office Action dated Jul. 19, 2022, issued in counterpart JP application No. 2021-517969, with English translation. (11 pages).
Office Action dated Feb. 21, 2023, issued in counterpart JP application No. 2021-517969, with English translation. (5 pages).
Office Action dated Mar. 14, 2023, issued in counterpart KR application No. 10-2021-7009259, with English translation. (10 pages).
Office Action dated Sep. 22, 2023, issued in counterpart KR application No. 10-2021-7009259, with English translation. (4 pages).
International Search Report dated Apr. 14, 2021, issued in counterpart International application No. PCT/CN2021/076382, with English translation. (7 pages).
Extended (Supplementary) European Search Report dated Oct. 20, 2023, issued in counterpart EP application No. 21776075.0. (15 pages).

\* cited by examiner

METHOD FOR MANAGING CHARGING AND DISCHARGING OF PARALLEL-CONNECTED BATTERY PACK, ELECTRONIC DEVICE, AND ELECTRICAL SYSTEM

CROSS REFERENCE TO THE RELATED APPLICATIONS

The present application is a National Stage application of PCT international application: PCT/CN2021/076382 which claims the benefit of priority from the Chinese Patent Application NO. 202010230929.9 filed on 27 Mar. 2020, the disclosure of which is hereby incorporated by reference in its entirety.

TECHNICAL FIELD

This application relates to the technical field of a power supply, and in particular, to a method for managing charging and discharging of a parallel-connected battery pack, an electronic device, and an electrical system.

BACKGROUND

To meet increased user requirements for power and endurance time of an energy storage battery, a single-battery-pack solution requires a higher energy density and a higher capacity of a battery cell of the battery pack, thereby increasing a volume and a weight of the battery pack and increasing costs of research and development, manufacturing, transportation, and installation of the battery pack. However, a parallel-connected battery pack solution, viewed from a research and development perspective, requires merely design of a low-capacity solution, thereby reducing research and development costs and safety certification costs for developers. A key to a parallel-connected battery pack is that a master battery pack needs to monitor status information of each slave battery pack in real time. When a battery pack is faulty, the master battery pack feeds back fault information to a power conversion system (PCS) in time, and the PCS can immediately reduce power or cut off load operation to ensure safe operation of the parallel-connected battery pack.

An existing technology of paralleling an energy storage system has the following problems: (1) prerequisites of paralleling battery packs are that the battery packs stand statically and have consistent voltages, and the voltages of the battery packs have to be manually adjusted during charging and discharging, consequently increasing complexity and costs of mounting and debugging; and (2) in a case that the battery packs are connected in parallel when being charged or discharged, voltage is used as a unique basis for paralleling, consequently increasing burnout risks caused by a too high cross current in a power loop of the parallel-connected battery pack.

Solutions available in the prior art to such problems include: (1) before the battery packs are paralleled, a total voltage of each battery pack is manually adjusted, the battery packs are charged or discharged until the total voltage of each battery pack reaches a fixed voltage value, and the battery packs are paralleled after total voltages of all the battery packs have been adjusted properly; and (2) the battery packs are paralleled during charging or discharging, but a parameter used as a basis for paralleling is merely the voltage of each battery pack, and a charge or discharge current during the paralleling depends on a next-level load; and, when the voltage of a battery pack first incorporated into the power loop rises or falls to a value consistent with the voltage of an unincorporated battery pack during the charging or discharging, the unincorporated battery pack is connected to the power loop in parallel.

However, the solutions in the prior art have the following disadvantages: (1) in solution (1), the voltage of the battery pack needs to be adjusted manually, and the parallel connecting of the battery packs is not smart enough but increases the complexity and costs of mounting and debugging; and (2) in solution (2), merely a single parameter is used as a basis for the parallel connecting of battery pack, and the charge current and the discharge current are not limited. Consequently, the voltage is consistent between the parallel-connected battery packs but an actual capacity differs sharply, the cross current between the parallel-connected battery packs is too high, and the battery cells of the battery packs, the power loop, and devices are likely to be damaged by the too high cross current.

SUMMARY

In view of the foregoing situation, it is necessary to provide a method for managing charging and discharging of a parallel-connected battery pack, an electronic device, and an electrical system to enhance automation of paralleling of the battery packs, increase adaptability of a paralleling system, improve paralleling efficiency, further reduce operation and maintenance costs, and improve user experience.

An embodiment of this application provides a method for managing charging and discharging of a parallel-connected battery pack. The method for managing charging and discharging of a parallel-connected battery pack includes: obtaining a voltage value and a state of charge of a plurality of battery packs; comparing the voltage value and the state of charge of each of the battery packs with a reference voltage value and a reference state of charge; and managing charging and discharging of the plurality of battery packs based on a comparison result.

According to some embodiments of this application, the reference voltage value may be obtained by: using a minimum value of voltage values of the plurality of battery packs as the reference voltage value when none of the plurality of battery packs is connected to a power bus.

According to some embodiments of this application, the reference state of charge may be obtained by: using a minimum value of states of charge of the plurality of battery packs as the reference state of charge when none of the plurality of battery packs is connected to a power bus.

According to some embodiments of this application, the reference voltage value may also be obtained by: using a minimum value of voltage values of battery packs already connected to a power bus as the reference voltage value when at least a battery pack is already connected to the power bus.

According to some embodiments of this application, the reference state of charge may also be obtained by: using a minimum value of states of charge of battery packs already connected to a power bus as the reference state of charge when a battery pack is already connected to the power bus.

According to some embodiments of this application, the method for managing charging and discharging of a parallel-connected battery pack further includes: obtaining a quantity of battery packs already connected to a power bus; and determining a charge current limit value $I_{charge}$ and a discharge current limit value $I_{discharge}$ of a power conversion system.

According to some embodiments of this application, the charge current limit value $I_{charge}$ satisfies the following formula:

$$I_{charge} = a \times k_1 \times P_m,$$

where, a is a 1C current of the battery pack, $k_1$ is a charge current-limiting coefficient, and $P_m$ is the quantity of battery packs already connected to the power bus.

According to some embodiments of this application, the discharge current limit value $I_{discharge}$ satisfies the following formula:

$$I_{discharge} = a \times k_2 \times P_m,$$

where, a is a 1C current of the battery pack, $k_2$ is a discharge current-limiting coefficient, and $P_m$ is the quantity of battery packs already connected to the power bus.

According to some embodiments of this application, the step of managing charging and discharging of the plurality of battery packs based on a comparison result includes: determining, when none of the plurality of battery packs is connected to a power bus, whether a difference between the voltage value of all the battery packs and the reference voltage value is less than a first threshold, and whether a difference between the state of charge of all the battery packs and the reference state of charge is less than a second threshold; and controlling the battery packs to sequentially connect to the power bus if the difference between the voltage value of all the battery packs and the reference voltage value is less than the first threshold, and if the difference between the state of charge of all the battery packs and the reference state of charge is less than the second threshold.

According to some embodiments of this application, the step of managing charging and discharging of the plurality of battery packs based on a comparison result further includes: determining, when at least one battery pack is already connected to the power bus and the battery back is in a charging state, whether a difference between the voltage value of battery packs not connected to the power bus and the reference voltage value is within a first range, and whether a difference between the state of charge of the battery packs not connected to the power bus and the reference state of charge is within a second range; and controlling the battery packs to sequentially connect to the power bus if the difference between the voltage value of all the battery packs not connected to the power bus and the reference voltage value is within the first range, and if the difference between the state of charge of all the battery packs not connected to the power bus and the reference state of charge is within the second range.

According to some embodiments of this application, the step of managing charging and discharging of the plurality of battery packs based on a comparison result further includes: determining, when at least one battery pack is already connected to the power bus and the battery backs not connected to the power bus are in a discharging state, whether a difference between the reference voltage value and the voltage value of all the battery packs not connected to the power bus is within a third range, and whether a difference between the reference state of charge and the state of charge of all the battery packs not connected to the power bus is within a fourth range; and controlling the battery packs to sequentially connect to the power bus if the difference between the reference voltage value and the voltage value of all the battery packs not connected to the power bus is within the third range, and if the difference between the reference state of charge and the state of charge of all the battery packs not connected to the power bus is within the fourth range.

According to some embodiments of this application, the method for managing charging and discharging of a parallel-connected battery pack further includes: receiving fault alarm information when a fault alarm occurs on a battery pack; and controlling all the battery packs to disconnect from the power bus or controlling the faulty battery pack to separately disconnect from the power bus.

An embodiment of this application further provides an electronic device. The electronic device includes:
  a plurality of battery packs; and
  a battery management unit, configured to perform the foregoing method for managing charging and discharging.

According to some embodiments of this application, the electronic device further includes a plurality of switches in one-to-one correspondence to a plurality of battery packs, and each switch is connected between the battery packs and a power conversion system.

An embodiment of this application further provides an electrical system. The electrical system includes a power conversion system and the electronic device. The electronic device further includes a plurality of switches in one-to-one correspondence to a plurality of battery packs. Each switch is connected between the battery packs and the power conversion system.

In the method for managing charging and discharging of a parallel-connected battery pack, the electronic device, and the electrical system according to the embodiments of this application, the voltage value and the state of charge of a plurality of battery packs are obtained, the voltage value and the state of charge of each of the battery packs is compared with a reference voltage value and a reference state of charge, and the charging and discharging of the plurality of battery packs is managed based on a comparison result. In this way, the technical solution provided herein can enhance automation of paralleling of battery packs, increase adaptability of a paralleling system, improve paralleling efficiency, further reduce operation and maintenance costs, and improve user experience.

REFERENCE NUMERALS

Figure 1:
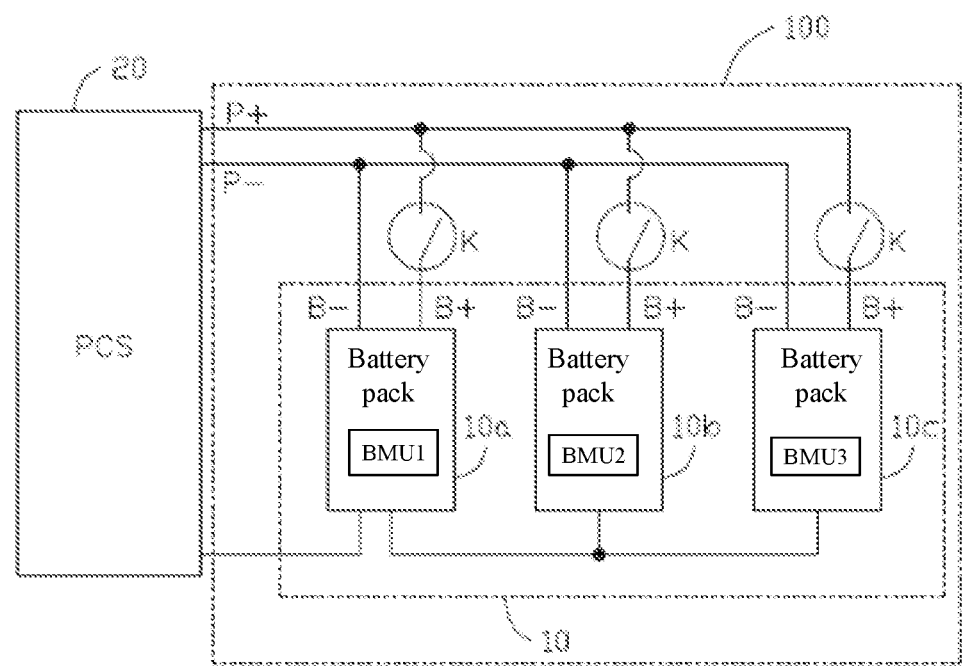
FIG. 1 is a structural diagram of a paralleling system of a parallel-connected battery pack according to an embodiment of this application.

Electronic device 100
Parallel-connected battery pack 10
Battery packs 10a, 10b, 10c
Power conversion system 20
System for managing charging and discharging of a parallel-connected battery pack 30
Switch K
Battery management units BMU 1, BMU 2, BMU 3
Obtaining module 301
Comparison module 302
Control module 303

This application is described in further detail below with reference to specific embodiments and the drawings.

DETAILED DESCRIPTION OF EMBODIMENTS

The following clearly and fully describes the technical solutions in the embodiments of this application with reference to the drawings hereof. Apparently, the described embodiments are merely a part of but not all of the embodiments of this application.

Referring to FIG. 1, FIG. 1 is a structural diagram of a paralleling system of a parallel-connected battery pack 10 according to an embodiment of this application.

An embodiment of this application provides an electrical system. The electrical system includes an electronic device 100 and a power conversion system 20. The electronic device 100 in the embodiment of this application is electrically connected to the power conversion system 20. The electronic device 100 may include the parallel-connected battery pack 10.

Specifically, the parallel-connected battery pack 10 may include a plurality of battery packs connected in parallel (FIG. 1 uses three battery packs 10a, 10b, and 10c as an example, but more or less than three battery packs may be connected in parallel).

Each battery pack 10a, 10b, 10c includes a positive electrode B+ and a negative electrode B−. The positive electrodes B+ of the battery packs 10a-10c are connected together to form a positive electrode of the parallel-connected battery pack 10, and the negative electrodes B− of the battery packs 10a-10c are connected together to form a negative electrode of the parallel-connected battery pack 10. An output of the parallel-connected battery pack 10 is converged to a direct-current input side of the power conversion system 20. Specifically, the negative electrode B− of the battery packs 10a, 10b, and 10c is electrically connected to a power bus P− of the power conversion system 20. The positive electrode B+ of the battery packs 10a, 10b, and 10c is electrically connected to a power bus P+ of the power conversion system 20 through a switch K. In this embodiment of this application, the quantity of switches is identical to the quantity of the battery packs, and the switches are in one-to-one correspondence to the battery packs. To be specific, power lines of each battery pack may be connected in parallel to the power buses P+ and P− through the corresponding switch K.

In an embodiment of this application, each battery pack 10a, 10b, 10c further includes an internal bus interface and an external bus interface. The internal bus interface can implement an internal bus communication function, and the external bus interface can implement an external bus communication function. Understandably, the internal bus communication function can implement internal communication between the battery packs 10a-10c, and the external bus communication function can implement communication between a master battery pack and the power conversion system 20.

In an optional embodiment, the internal bus and the external bus may be a controller area network (CAN) communication bus or an RS485 communication bus.

In an embodiment of this application, one of the battery packs in the parallel-connected battery pack 10 may be a master battery pack, and remaining battery packs may be slave battery packs.

Understandably, a battery management unit may be disposed in each battery pack. Battery cells of each battery pack are managed by a corresponding battery management unit. To be specific, in this embodiment of this application, on/off states of the plurality of switches K may be controlled by the corresponding battery management unit. Specifically, in this embodiment of this application, the battery pack 10a is a master battery pack, and the battery packs 10b and 10c are slave battery packs. A battery management unit BMU 1 is disposed in the battery pack 10a, and battery management units BMU 2 and BMU 3 are disposed in the battery packs 10b and 10c respectively.

Subsequently, the battery management unit in the slave battery pack sends data information and status of the corresponding battery pack to the battery management unit in the master battery pack through the internal bus. In this way, the battery management unit in the master battery pack may aggregate and analyze the data information and status of all the battery management units (including the battery management unit of the master battery pack), calculate a corresponding control parameter, and then control each battery management unit separately through the internal bus, and may, through the external bus, exchange data with the power conversion system 20 and perform operation scheduling.

Figure 2:
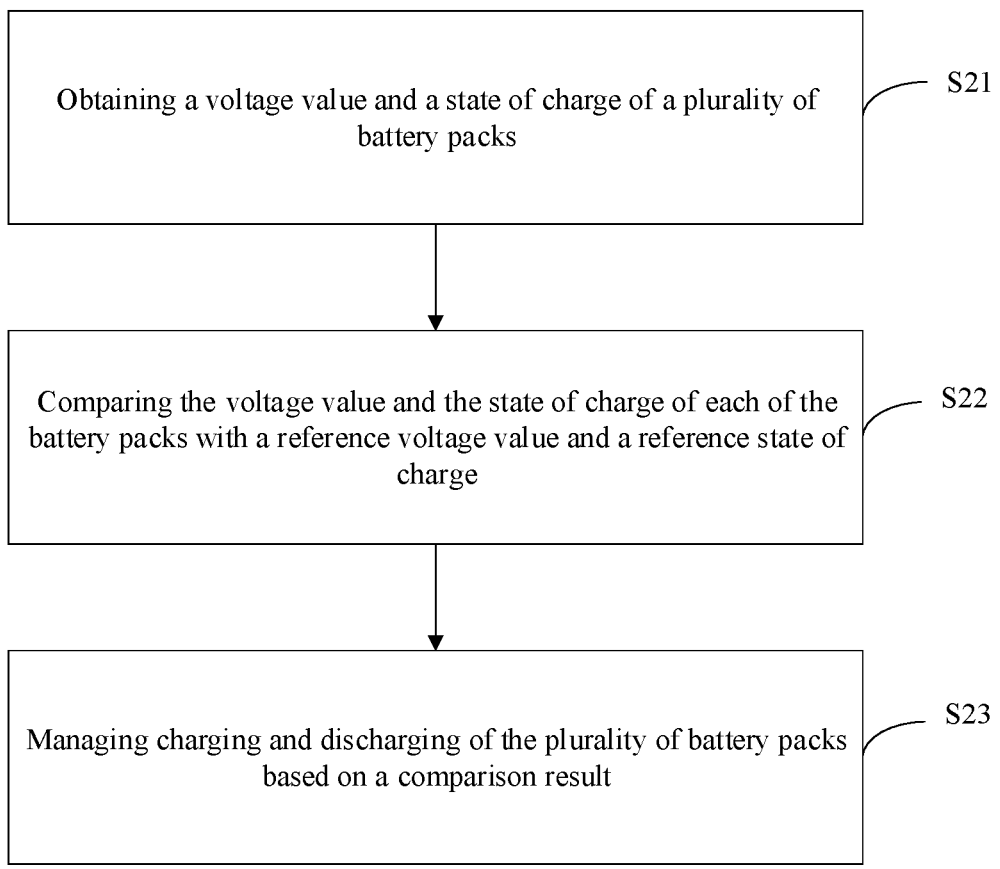
FIG. 2 is a flowchart of a method for managing charging and discharging of a parallel-connected battery pack according to an embodiment of this application.

Referring to FIG. 2, FIG. 2 is a flowchart of a method for managing charging and discharging of a parallel-connected battery pack according to an embodiment of this application. The method for managing charging and discharging of a parallel-connected battery pack may include the following steps.

Step S21: Obtaining a voltage value and a state of charge of a plurality of battery packs.

In this embodiment of this application, the battery management unit in each slave battery pack sends data information and status of a corresponding battery pack to a battery management unit in a master battery pack through an internal bus. For example, the battery management unit BMU 1 in the battery pack 10a may obtain voltage values and states of charge of the battery packs 10b and 10c through the battery management units BMU 2 and BMU 3.

Understandably, the state of charge (state of charge, SOC) means a ratio of a remaining capacity of a battery to a fully charged capacity of the battery.

Step S22: Comparing the voltage value and the state of charge of each of the battery packs with a reference voltage value and a reference state of charge.

Specifically, when performing dynamic paralleling of power, a total voltage value of each battery pack needs to be compared with a reference voltage value, and an SOC of each battery pack needs to be compared with a reference SOC.

The reference voltage value and the reference SOC of the dynamic paralleling of power are calculated by the battery management unit of the master battery pack.

In a preferred embodiment, the reference voltage value may be obtained by: using a minimum value of voltage values of the plurality of battery packs 10a-10c as the reference voltage value if none of the plurality of battery packs 10a-10c is connected to a power bus.

In a preferred embodiment, the reference SOC may be obtained by: using a minimum value of SOCs of the plurality of battery packs 10a-10c as the reference SOC if none of the plurality of battery packs 10a-10c is connected to the power bus.

According to another preferred embodiment of this application, the reference voltage value may also be obtained by: using a minimum value of voltage values of battery packs already connected to the power bus as the reference voltage value if any battery pack in the plurality of battery packs 10a-10c is already connected to the power bus.

According to another preferred embodiment of this application, the reference SOC may also be obtained by: using a minimum value of SOCs of battery packs already connected to the power bus as the reference SOC if any battery pack in the plurality of battery packs 10a-10c is already connected to the power bus.

Step S23: Managing charging and discharging of the plurality of battery packs based on a comparison result.

In this embodiment of this application, after the reference voltage value and the reference SOC are determined, the battery management unit of the master battery pack compares the voltage value and the SOC of each battery pack with the reference voltage value and the reference SOC to manage charging and discharging of the plurality of battery packs based on a comparison result.

Dynamic paralleling of power requires coordination of the power conversion system. To be specific, during dynamic paralleling of the battery pack, the power conversion system needs to perform charging or discharging according to a current limit value calculated by the battery management unit of the master battery pack.

Figure 3:
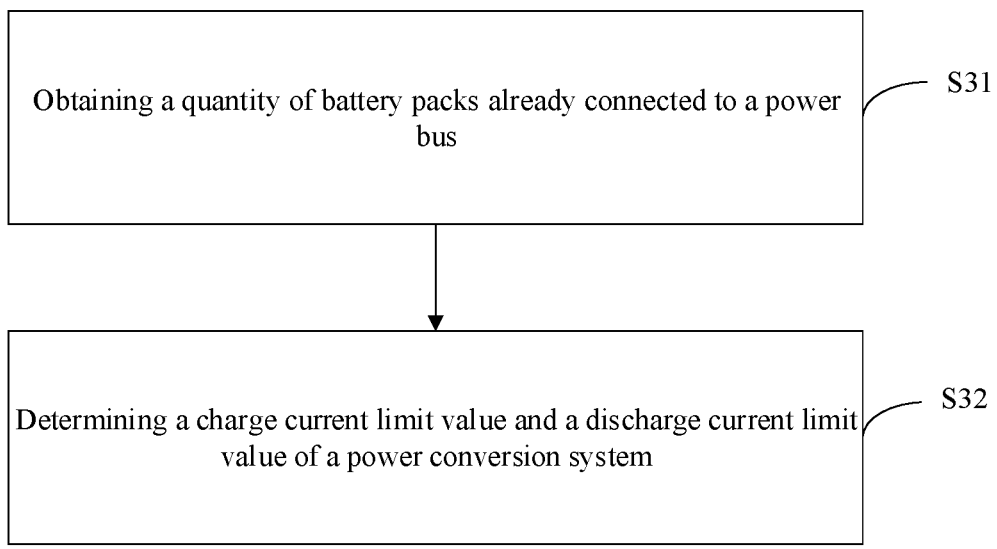
FIG. 3 is a flowchart of a method for managing charging and discharging of a parallel-connected battery pack according to another embodiment of this application.

In a preferred embodiment, referring to FIG. 3, the battery management unit of the master battery pack specifically calculates the charge current limit value and the discharge current limit value by performing the following steps:

Step S31: Obtaining a quantity of battery packs already connected to a power bus.

In this embodiment of this application, the battery management unit of the master battery pack obtains the quantity of the battery packs already connected to the power bus.

Step S32: Determining a charge current limit value and a discharge current limit value of a power conversion system.

In this embodiment of this application, the charge current limit value of the power conversion system is denoted as $I_{charge}$ and the discharge current limit value is denoted as $I_{discharge}$.

Specifically, the charge current limit value $I_{charge}$ satisfies the following formula:

$$I_{charge} = a \times k_1 \times P_m \quad (1)$$

where, a is a 1C current of the battery pack, $k_1$ is a charge current-limiting coefficient, and $P_m$ is the quantity of battery packs already connected to the power bus.

Further, the discharge current limit value $I_{discharge}$ satisfies the following formula:

$$I_{discharge} = a \times k_2 \times P_m \quad (2)$$

where, a is a 1C current of the battery pack, $k_2$ is a discharge current-limiting coefficient, and $P_m$ is the quantity of battery packs already connected to the power bus.

In this embodiment of this application, when the power of no battery pack is connected onto the power bus, that is, when $P_m=0$, it can be deduced from the foregoing formula that the charge current limit value $I_{charge}$ of the power conversion system and the discharge current limit value $I_{discharge}$ are 0.

Figure 4:
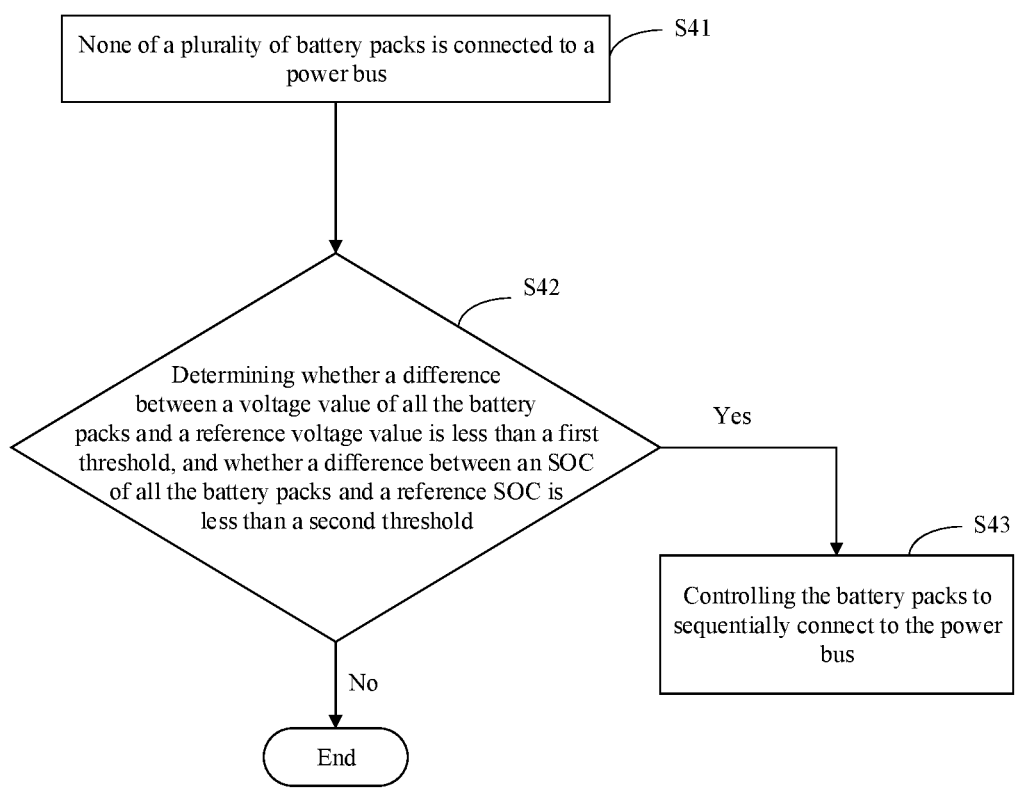
FIG. 4 is a flowchart of a method for managing charging and discharging of a parallel-connected battery pack according to another embodiment of this application.

In a preferred embodiment, referring to FIG. 4, the battery management unit determines, by performing the following steps and based on a comparison result of the voltage value and the SOC of the battery packs versus the reference voltage value and the reference SOC, how to manage charging and discharging of the plurality of battery packs:

Step S41: Determining that none of the plurality of battery packs is connected to the power bus.

In this embodiment of this application, the battery management unit of the master battery pack may determine, based on the data information and status fed back by the battery management unit of each slave battery pack, whether none of the plurality of battery packs is connected to the power bus.

Specifically, if it is determined that the power of no battery pack is connected to the power bus, that is, if none of the battery packs 10a, 10b, and 10c in this embodiment of this application is connected to the power bus, the battery management unit BMU 1 of the battery pack 10a sends the charge current limit value $I_{charge}$ and the discharge current limit value $I_{discharge}$ to the power conversion system through an external bus, both being 0. In this case, it is determined that the reference voltage value of the dynamically paralleled battery pack is the minimum value of the voltage values of the plurality of battery packs, and the reference SOC of the dynamically paralleled battery pack is the minimum value of the SOCs of the plurality of battery packs.

Step S42: Determining whether a difference between the voltage value of all the battery packs 10a-10c and the reference voltage value is less than a first threshold, and whether a difference between the SOC of all the battery packs 10a-10c and the reference SOC is less than a second threshold. If the difference is less than the first threshold and the second threshold, the process proceeds to step S43.

In this embodiment of this application, the battery management unit BMU 1 of the battery pack 10a compares the collected total voltage of each battery pack with the reference voltage value, and compares the collected SOC of each battery pack with the reference SOC.

Subsequently, the battery management unit BMU 1 of the battery pack 10a determines whether the difference between the voltage value of all the battery packs and the reference voltage value is less than the first threshold, and whether the difference between the SOC of all the battery packs and the reference SOC is less than the second threshold.

Step S43: Controlling the battery packs to sequentially connect to the power bus.

In this embodiment of this application, if the difference between the voltage value of all the battery packs 10a-10c and the reference voltage value is less than the first threshold, and if the difference between the SOC of all the battery packs 10a-10c and the reference SOC is less than the second threshold, the battery management unit BMU 1 of the battery pack 10a resets a power paralleling command of each battery pack. Then the battery management units BMU 1, BMU 2, and BMU 3 turn on the switch K, and the plurality of battery packs 10a-10c are sequentially connected to the power bus. In this way, paralleling of the power of all the battery packs to the power bus is completed, and a power paralleling completion flag is reset.

Figure 5:
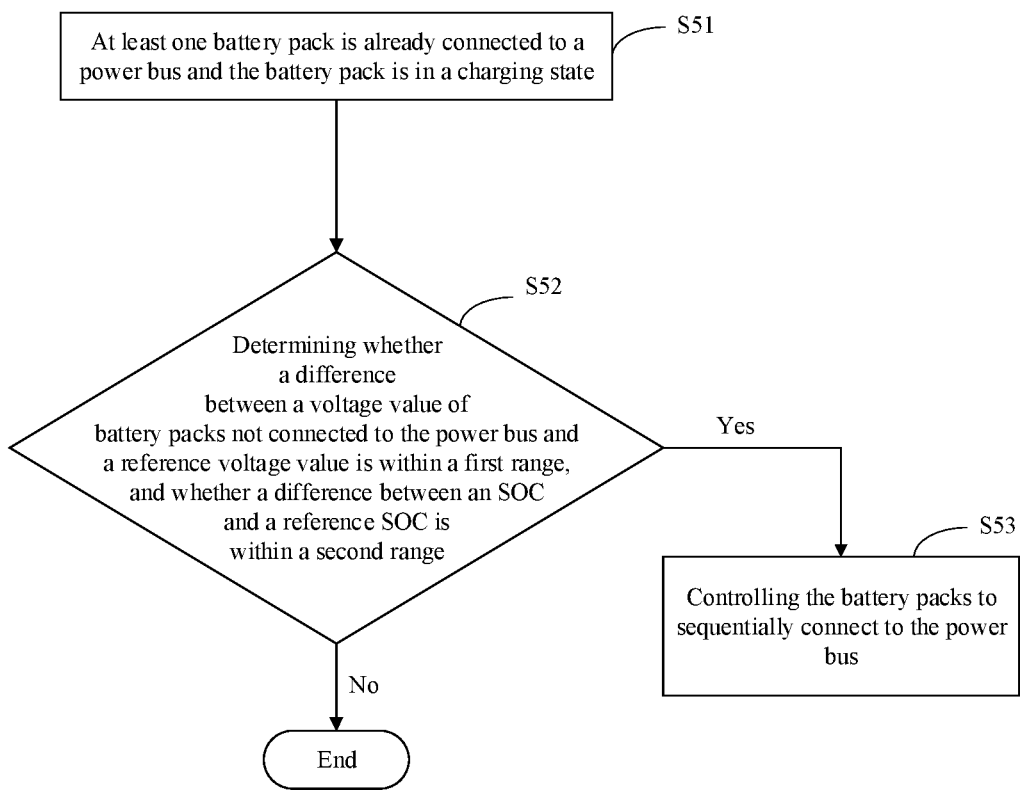
FIG. 5 is a flowchart of a method for managing charging and discharging of a parallel-connected battery pack according to another embodiment of this application.

In another preferred embodiment, referring to FIG. 5, the battery management unit determines, by performing the following steps and based on a comparison result of the voltage value and the SOC of the battery packs versus the reference voltage value and the reference SOC, how to manage charging and discharging of the plurality of battery packs:

Step S51: Determining that at least one battery pack is already connected to the power bus and the battery pack is in a charging state.

In this embodiment of this application, if it is determined that at least one battery pack is already connected to the power bus and the battery pack is in the charging state, the battery management unit of the master battery pack sends a charge current limit value $I_{charge}$ and a discharge current limit value $I_{discharge}$ to the power conversion system 20 through an external bus. Therefore, the power conversion system 20 outputs a charge current and a discharge current according to the corresponding charge current limit value and discharge current limit value.

Step S52: Determining whether the difference between the voltage value of the battery packs not connected to the power bus and the reference voltage value is within a first range, and whether the difference between the SOC and the reference SOC is within a second range. If the difference is within the first range and the second range, the process proceeds to step S53.

For example, in this embodiment of this application, when the battery pack 10*a* is already connected to the power bus but the battery packs 10*b* and 10*c* are not connected to the power bus, the battery management unit BMU 1 determines whether the difference between the voltage value of the battery packs 10*b* and 10*c* and the reference voltage value is within the first range. In addition, the battery management unit BMU 1 determines whether the difference between the SOC of the battery packs 10*b* and 10*c* and the reference SOC is within the second range.

Step S53: Controlling the battery packs to sequentially connect to the power bus.

In this embodiment of this application, if the difference between the voltage value of the battery packs not connected to the power bus and the reference voltage value is within the first range, and if the difference between the SOC and the reference SOC is within the second range, the battery management unit BMU 1 of the master battery pack resets the power paralleling command of each battery pack. Then the battery management units turn on the switch K, and the battery packs not connected to the power bus are sequentially connected to the power bus. In this way, paralleling of the power of all the battery packs to the power bus is completed, and the power paralleling completion flag is reset.

Figure 6:
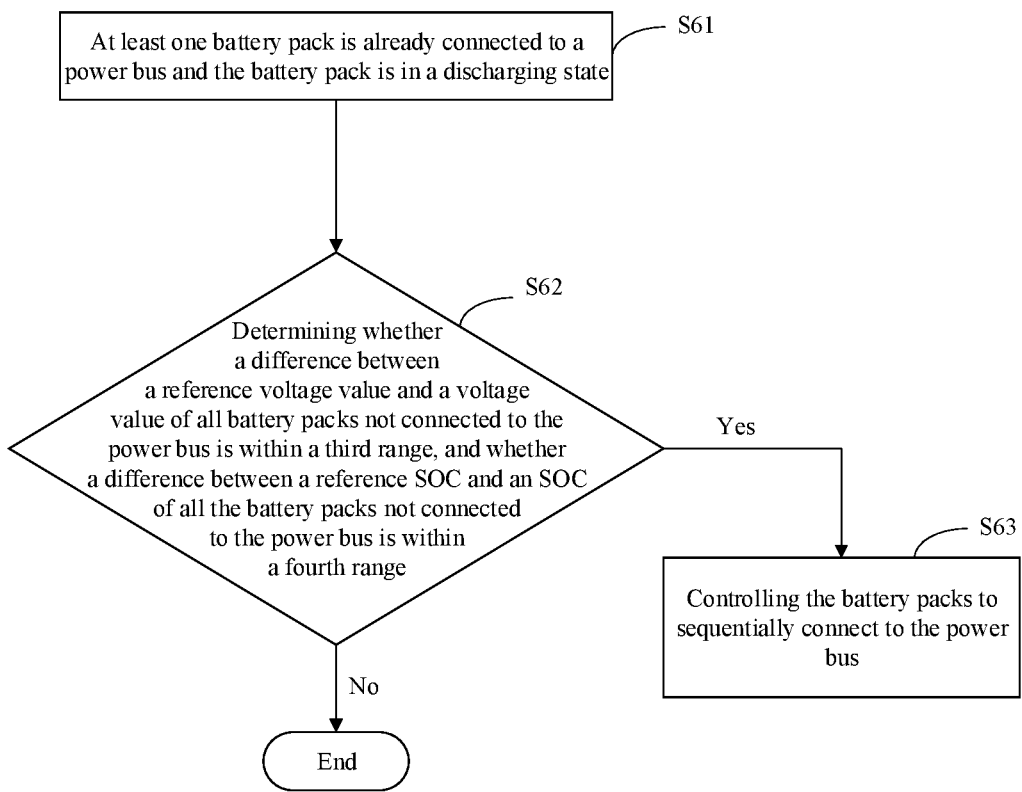
FIG. 6 is a flowchart of a method for managing charging and discharging of a parallel-connected battery pack according to another embodiment of this application.

In another preferred embodiment, referring to FIG. 6, the battery management unit determines, by performing the following steps and based on a comparison result of the voltage value and the SOC of the battery packs versus the reference voltage value and the reference SOC, how to manage charging and discharging of the plurality of battery packs:

Step S61: Determining that at least one battery pack is already connected to the power bus and the battery pack is in a discharging state.

In this embodiment of this application, if it is determined that at least one battery pack is already connected to the power bus and the battery pack is in the discharging state, the battery management unit of the master battery pack sends a charge current limit value $I_{charge}$ and a discharge current limit value $I_{discharge}$ to the power conversion system 20 through an external bus. Therefore, the power conversion system 20 outputs a charge current and a discharge current according to the corresponding charge current limit value and discharge current limit value.

Step S62: Determining whether the difference between the reference voltage value and the voltage value of all the battery packs not connected to the power bus is within a third range, and whether the difference between the reference SOC and the SOC of all the battery packs not connected to the power bus is within a fourth range. If the difference is within the third range and the fourth range, the process proceeds to step S63.

For example, in this embodiment of this application, when the battery pack 10*a* is already connected to the power bus but the battery packs 10*b* and 10*c* are not connected to the power bus, the battery management unit BMU 1 determines whether the difference between the reference voltage value and the voltage value of the battery packs 10*b* and 10*c* is within the third range. In addition, the battery management unit BMU 1 determines whether the difference between the reference SOC and the SOC of the battery packs 10*b* and 10*c* is within the fourth range.

Step S63: Controlling the battery packs to sequentially connect to the power bus.

In this embodiment of this application, if the difference between the reference voltage value and the voltage value of all the battery packs not connected to the power bus is within the third range, and if the difference between the reference SOC and the SOC of all the battery packs not connected to the power bus is within the fourth range, the battery management unit BMU 1 of the master battery pack resets the power paralleling command of each battery pack. Then the battery management units turn on the switch K, and the battery packs not connected to the power bus are sequentially connected to the power bus. In this way, paralleling of the power of all the battery packs to the power bus is completed, and the power paralleling completion flag is reset.

Understandably, as the charging or discharging of the power conversion system 20 continues, the battery management unit of the master battery pack calculates and updates the reference voltage value and the reference SOC in real time. If the voltage value and the SOC of the battery packs not connected to the power bus satisfy power paralleling conditions one by one during the charging or discharging, the battery packs will be connected to the power bus one by one, and the power paralleling completion flag of the battery packs will be reset one by one. As the quantity of the paralleled battery packs increases, the charge current limit value $I_{charge}$ and the discharge current limit value $I_{discharge}$ is calculated and updated in real time until all the battery packs have completed paralleling. In this case, the battery packs reset the power paralleling completion flag, and the master battery pack resets a main flag of power paralleling completion, and stops calculating the reference voltage value and the reference SOC. The calculation method of charge current limit value $I_{charge}$ and the discharge current limit value $I_{discharge}$ is changed from a current limiting method of power paralleling mode to a charge and discharge current limit value method of a normal operation mode of the energy storage system. That is, all the battery packs of the energy storage system exit the power paralleling mode. The power conversion system receives the main flag of power paralleling completion as well as the charge and discharge current limit values of the normal operation mode from the battery management unit of the master battery pack, and the power conversion system and the energy storage system enter the normal operation mode synchronously.

In this embodiment of this application, when the battery management unit of each battery pack (such as BMU 2 in the battery pack 10*b*) raises a fault alarm, the battery management unit of the master battery pack (such as BMU 1 in the battery pack 10*a*) receives fault alarm information of each battery pack, and then controls all the battery packs to disconnect from the power bus, or controls the faulty battery pack to separately disconnect from the power bus. The disconnected battery pack removes the power paralleling completion flag, the battery management BMU 1 in the master battery pack removes the power paralleling completion flag, and the energy storage system exits the normal operation mode and re-enters a power paralleling determining mode.

Figure 7:
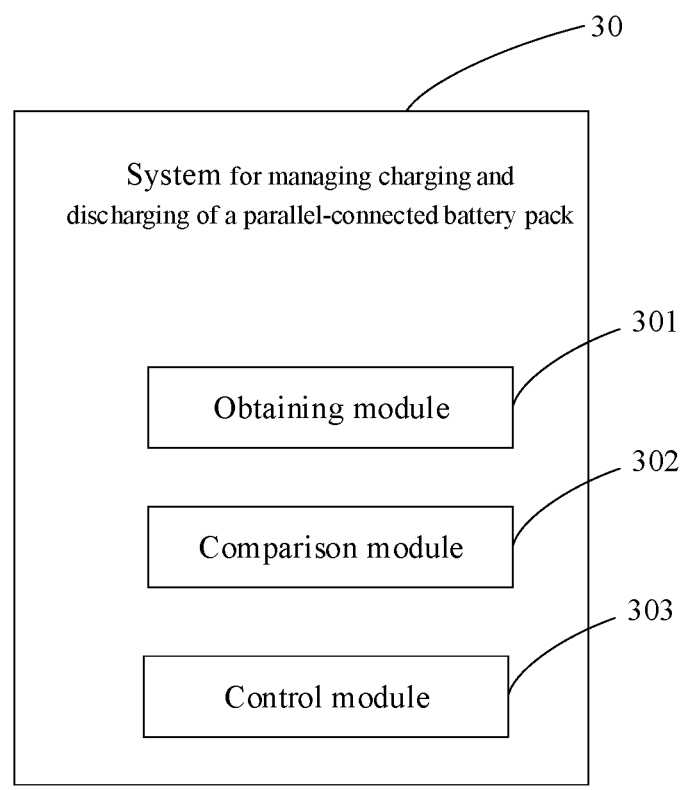
FIG. 7 is a modular diagram of a system for managing charging and discharging of a parallel-connected battery pack according to an embodiment of this application.

FIG. 7 is a schematic diagram of a system 30 for managing charging and discharging of a parallel-connected battery pack according to an embodiment of this application. In this embodiment, the system 30 for managing charging and discharging of a parallel-connected battery pack may be divided into one or more modules. The one or more modules are stored in the battery management unit BMU 1, and are managed by the battery management unit BMU 1. When executing a computer program, the battery management unit BMU 1 implements the steps described in the embodiment of the method for managing charging and discharging of a parallel-connected battery pack to implement this application. The one or more modules may be a series of computer program instruction segments capable of implementing specific functions. The instruction segments are used to describe a process of implementing the system 30 for managing charging and discharging of a parallel-connected battery pack in the electronic device 100. For example, the system 30 for managing charging and discharging of a parallel-connected battery pack may be divided into an obtaining module 301, a comparison module 302, and a control module 303 in FIG. 7.

The obtaining module 301 is configured to obtain a voltage value and an SOC of a plurality of battery packs.

The comparison module 302 is configured to compare the voltage value and the SOC of each of the battery packs with a reference voltage value and a reference SOC.

The control module 303 is configured to manage charging and discharging of the plurality of battery packs based on a comparison result.

The system for managing charging and discharging of a parallel-connected battery pack 30 can manage charging and discharging of the battery packs 10*a*-10*c*, enhance automation of paralleling of the battery packs, increase adaptability of a paralleling system, improve paralleling efficiency, further reduce operation and maintenance costs, and improve user experience. Details may be obtained by referring to the embodiment of the method for managing charging and discharging of a parallel-connected battery pack, and are omitted here.

Understandably, the division into the modules is a logical function division, and may be in other division forms in actual implementation. In addition, function modules in each embodiment of this application may be integrated into one processing unit, or each module may exist physically alone, or two or more modules may be integrated into one unit. The integrated module may be implemented in form of hardware, or may be implemented in form of hardware plus a software function module.

A person of ordinary skill in the art understands that the foregoing embodiments are merely intended to illustrate this application, but not intended as a limitation on this application. All appropriate modifications and changes made to the embodiments without departing from the spirit and scope of this application fall within the protection scope of this application.

What is claimed is:

1. A method for managing charging and discharging of a plurality of battery packs connected in parallel, comprising:
   obtaining a voltage value and a state of charge of the plurality of battery packs connected in parallel;
   comparing the voltage value and the state of charge of each of the plurality of battery packs with a reference voltage value and a reference state of charge; and
   managing charging and discharging of the plurality of battery packs based on a comparison result, and managing the plurality of battery packs connecting to a power bus based on the comparison result.

2. The method for managing charging and discharging of a plurality of battery packs connected in parallel according to claim 1, wherein the reference voltage value is obtained by using a minimum value of voltage values of the plurality of battery packs as the reference voltage value when none of the plurality of battery packs is connected to a power bus.

3. The method for managing charging and discharging of a plurality of battery packs connected in parallel according to claim 1, wherein the reference state of charge is obtained by using a minimum value of states of charge of the plurality of battery packs as the reference state of charge when none of the plurality of battery packs is connected to a power bus.

4. The method for managing charging and discharging of a plurality of battery packs connected in parallel according to claim 1, wherein the reference voltage value is obtained by using a minimum value of voltage values of battery packs already connected to a power bus as the reference voltage value when at least one battery pack is already connected to the power bus.

5. The method for managing charging and discharging of a plurality of battery packs connected in parallel according to claim 1, wherein the reference state of charge is obtained by using a minimum value of states of charge of battery packs already connected to a power bus as the reference state of charge when at least one battery pack is already connected to the power bus.

6. The method for managing charging and discharging of a plurality of battery packs connected in parallel according to claim 1, further comprising:
   obtaining a quantity of battery packs already connected to a power bus; and
   determining a charge current limit value $I_{charge}$ and a discharge current limit value $I_{discharge}$ of a power conversion system.

7. The method for managing charging and discharging of a plurality of battery packs connected in parallel according to claim 6, wherein $$I_{charge} = a \times k_1 \times P_m,$$

wherein, $I_{charge}$ is the charge current limit value, a is a 1C current of the battery pack, $k_1$ is a charge current-limiting coefficient, and $P_m$ is the quantity of battery packs already connected to the power bus.

8. The method for managing charging and discharging of a plurality of battery packs connected in parallel according to claim 6, wherein $$I_{discharge} = a \times k_2 \times P_m,$$

wherein, $I_{discharge}$ is the discharge current limit value $I_{discharge}$, a is a 1C current of the battery pack, $k_2$ is a discharge current-limiting coefficient, and $P_m$ is the quantity of battery packs already connected to the power bus.

9. The method for managing charging and discharging of a plurality of battery packs connected in parallel according to claim 1, wherein the managing charging and discharging of the plurality of battery packs based on a comparison result comprises:
   determining, when none of the plurality of battery packs is connected to a power bus, whether a difference between the voltage value of all the battery packs and the reference voltage value is less than a first threshold, and whether a difference between the state of charge of all the battery packs and the reference state of charge is less than a second threshold; and
   controlling the battery packs to sequentially connect to the power bus if the difference between the voltage value of all the battery packs and the reference voltage value is less than the first threshold, and if the difference between the state of charge of all the battery packs and the reference state of charge is less than the second threshold.

10. The method for managing charging and discharging of a plurality of battery packs connected in parallel according to claim 9, wherein the managing charging and discharging of the plurality of battery packs based on a comparison result further comprises:
   determining, when at least one battery pack is already connected to the power bus and the battery pack is in a charging state, whether a difference between the voltage value of battery packs not connected to the power bus and the reference voltage value is within a first range, and whether a difference between the state of charge of the battery packs not connected to the power bus and the reference state of charge is within a second range; and
   controlling the battery packs to sequentially connect to the power bus if the difference between the voltage value of all the battery packs not connected to the power bus and the reference voltage value is within the first range, and if the difference between the state of charge of all the battery packs not connected to the power bus and the reference state of charge is within the second range.

11. The method for managing charging and discharging of a plurality of battery packs connected in parallel according to claim 10, wherein the managing charging and discharging of the plurality of battery packs based on a comparison result further comprises:
   determining, when at least one battery pack is already connected to the power bus and the battery packs not connected to the power bus are in a discharging state, whether a difference between the reference voltage value and the voltage value of all the battery packs not connected to the power bus is within a third range, and whether a difference between the reference state of charge and the state of charge of all the battery packs not connected to the power bus is within a fourth range; and
   controlling the battery packs to sequentially connect to the power bus if the difference between the reference voltage value and the voltage value of all the battery packs not connected to the power bus is within the third range, and if the difference between the reference state of charge and the state of charge of all the battery packs not connected to the power bus is within the fourth range.

12. The method for managing charging and discharging of a plurality of battery packs connected in parallel according to claim 11, further comprising:
   receiving fault alarm information when a fault alarm occurs on a battery pack; and
   controlling all the battery packs to disconnect from the power bus or controlling the faulty battery pack to separately disconnect from the power bus.

13. An electronic device, wherein the electronic device comprises:
   a plurality of battery packs; and
   a battery management unit, configured to perform the method for managing charging and discharging according to claim 1.

14. An electrical system, wherein the electrical system comprises a power conversion system and the electronic device according to claim 13, and the electronic device further comprises a plurality of switches in one-to-one correspondence to a plurality of battery packs, and each switch is connected between the battery packs and the power conversion system.

* * * * *